United States Patent [19]
Mar

[11] Patent Number: 5,900,752
[45] Date of Patent: May 4, 1999

[54] CIRCUIT AND METHOD FOR DESKEWING VARIABLE SUPPLY SIGNAL PATHS

[75] Inventor: Monte F. Mar, Issaquah, Wash.

[73] Assignee: Cypress Semiconductor Corp., San Jose, Calif.

[21] Appl. No.: 08/788,524

[22] Filed: Jan. 24, 1997

[51] Int. Cl.⁶ ...................................................... H03L 7/00
[52] U.S. Cl. .......................... 327/143; 327/111; 327/153; 327/270; 327/333
[58] Field of Search .................................... 327/111, 141, 327/143, 152, 153, 269, 270, 333; 326/80, 82

[56] References Cited

U.S. PATENT DOCUMENTS

| | | | |
|---|---|---|---|
| 5,521,530 | 5/1996 | Yao et al. | 326/80 |
| 5,656,961 | 8/1997 | Tran et al. | 327/184 |
| 5,712,883 | 1/1998 | Miller et al. | 375/371 |
| 5,742,183 | 4/1998 | Kuroda | 326/80 |

*Primary Examiner*—Margaret R. Wambach
*Attorney, Agent, or Firm*—Christopher P. Maiorana; Maiorana & Acosta, P.C.

[57] ABSTRACT

A circuit and method for deskewing signals by using cross power supply logic paths to compensate for delays created by power supplies operating at different voltages. A first replica circuit operating at a first supply voltage is placed in series with a first signal operating at a second supply voltage. A second replica circuit operating at the second supply voltage is placed in series with a second signal having a skew difference from the first signal and operating at the first supply voltage. The replica circuits generally have a scale factor which is generally a fraction of the equivalent driver circuits associated with the particular output signals. As a result, the present invention will deskew arbitrary power supply differences. By matching delays, the replica and true circuits provide the same delay. As a result, the sum of the delays for all the blocks in each path will be constant which maintains a desired skew difference between the output signals.

15 Claims, 3 Drawing Sheets

CIRCUIT AND METHOD FOR DESKEWING VARIABLE SUPPLY SIGNAL PATHS

FIELD OF THE INVENTION

The present invention relates to the deskewing of timing signals generally and, more particularly, to the deskewing of timing signals operating at different supply voltages.

BACKGROUND OF THE INVENTION

Deskewing of timing signals involves compensating for various parameters that may introduce delays between two or more timing signals which may result in the timing signals being unsynchronized. Deskewing may be necessary at either the output of a device or internally to the device. One parameter that may introduce delays is the power supply operating voltage. Deskewing may also be necessary for two signals generated from a single signal or for two signals that are deskewed at one power supply voltage value after which one signal is translated to a new power supply voltage value. Modern Central Processing Units (CPUs) and microprocessors generally tend to reduce the power supply operating voltages in order to reduce power consumption and increase the chip density, as well as for other performance considerations. Due to other design considerations, memory devices, such as dynamic random access memories (DRAMs) may operate at different supply voltages than the CPU. In a configuration where the CPU operates at a first supply voltage and the DRAM operates at a second supply voltage, the timing clocks associated with each device must generally be properly deskewed to maintain proper synchronization between the devices. One such configuration occurs with modern microprocessors which may operate at a 2.5 volt supply voltage, while DRAM chips generally operate at a 3.3 volt supply voltage.

Referring to FIG. 1, a previous approach deskewing circuit 10 is shown. The circuit 10 generally comprises an input 12, an output 14, an output 16 and a zero delay buffer 18. The input signal 12 generally receives a 2.5 volt supply clock that is presented directly to the output 14. The clock received at the input 12 is also presented to the zero delay buffer 18 which is then presented at the output 16. The zero delay buffer generally provides a conversion from a 2.5 volt supply clock to the 3.3 volt supply clock presented at the output 16. The zero delay buffer 18 may be based on a phase locked loop (PLL) implementation or even a delay-locked look (DLL).

The deskewing circuit 10 generally requires a large amount of silicon area to implement the a PLL or DLL. The amount of time delay between the two logic paths running at separate supply voltages is in the order of 2~5 ns. A relatively complex zero delay buffer 18 may be required to accurately deskew the 2~5 ns delay which, while possibly being practical on a board level design, is generally too large and complex a solution to be implemented directly on an integrated circuit. As a result, an approach that requires less area to implement is generally desired.

Referring to FIG. 2, a second previous approach deskewing circuit 30 is shown. The circuit 30 generally comprises an input 32, a programmable delay block 34, a logic block 36, an output 38 and an output 40. The input 32 generally receives a 3.3 volt supply clock which is generally presented to both the delay block 34 and to the logic block 36. The programmable delay block 34 generally has an input 35 which receives a trim control signal that generally programs the amount of delay introduced by the programmable delay block 34. The output 38 presents a 3.3 volt supply clock. The logic block 36 generally receives the 3.3 volt supply clock and provides a conversion to a 2.5 volt supply clock which is generally presented at the output 40. The programmable delay block 34 is generally used to provide the deskewing function of the circuit 30. The logic block 36 generally operates from a separate supply voltage to convert the output 40 to the 2.5 volt supply clock. The conversion of supply voltages creates a certain amount of delay, which is generally compensated for by the delay block 34.

The circuit 30 relies on the fact that a lower supply voltage generally causes a path to be slower. A disadvantage with the circuit 30 is that it relies on an open loop architecture. A single input 35 is used to determine the amount of delay presented by the delay block 34. As a result, as both power supplies vary, the delay between the output 38 and the output 40 will also vary. The output 38 and the output 40 may also vary in response to variations in processing. Under certain tolerant specifications, the circuit 30 may provide an adequate solution. However, in more stringent specifications, the power supply specification may vary from 2.5 volts to 3.3 volts and beyond while requiring a deskewed relationship, which the circuit 30 cannot provide.

Referring to FIG. 3, a third previous approach deskewing circuit 50 is shown. The circuit 50 generally comprises an input 52, a delay block 54, a variable delay block 56, a delay detector 58, an output 60 and an output 62. An input clock is generally received at the input 52 which operates a 3.3 volt supply voltage. The input clock received at the input 52 is generally presented to both the delay block 54 and the variable delay block 56. The delay block 54 generally presents a fixed amount of delay prior to presenting a 3.3 volt supply clock at the output 60. The delay block 56 presents a variable delay prior to presenting a 2.5 volt supply clock at the output 62. The delay detector 58 generally receives a feedback of both the 2.5 volt supply voltage clock from the output 62 and the 3.3 volt supply voltage clock from the output 60 and calculates a phase difference which is presented to an input 57 of the variable delay block 56. In response to the feedback signals, the variable delay block 56 adjusts for the actual delay between the output 60 and the output 62. The circuit 50 generally allows for deskewing of the outputs 60 and 62 at the output pad level. A problem associated with the circuit is that the output pads associated with a 2.5 volt and 3.3 volt signal have different propagation delays. As a result, the path through the output pads must be included in the deskewing loop as shown in FIG. 3.

While the circuit 50 has the advantage that it adjusts for process and power supply variations, it suffers from drawbacks associated with the presence of power supply noise. During situations where there is a sufficient amount of power supply noise, it is possible for the deskewing relationship between the outputs 60 and 62 to be lost.

SUMMARY OF THE INVENTION

The present invention concerns a circuit and method for deskewing signals by using cross power supply logic paths to compensate for delays created by power supplies operating at different voltages. A first replica circuit operating at a first supply voltage is placed in series with a first signal operating at a second supply voltage. A second replica circuit operating at the second supply voltage is placed in series with a second signal having a skew difference from the first signal and operating at the first supply voltage. The replica circuits generally have a scale factor which is generally a fraction of the equivalent driver circuits associated with the particular output signals. As a result, the present invention will deskew arbitrary power supply differences. By matching delays, the replica and true circuits a provide the same delay. As a result, the sum of the delays for all the blocks in each path will be constant which maintains a desired skew difference between the output signals.

The objects, features and advantages of the present invention include deskewing circuit output clocks running at different supply voltages while compensating for temperature process and supply voltage variations, using a minimum of chip real estate and providing accurate deskewing of the output signals.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
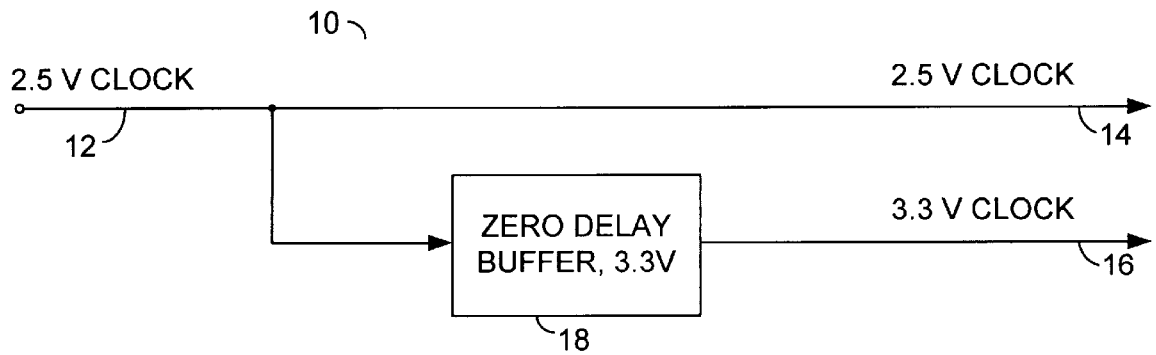
FIG. 1 is a previous approach deskewing circuit.
Figure 2:
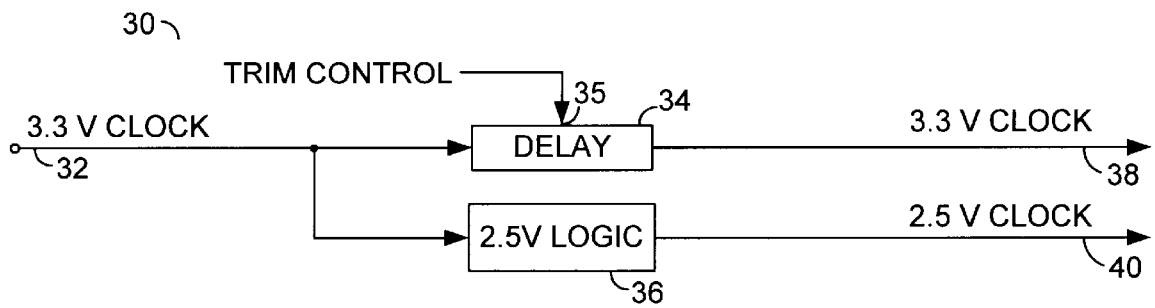
FIG. 2 is a second previous approach deskewing circuit.
Figure 3:
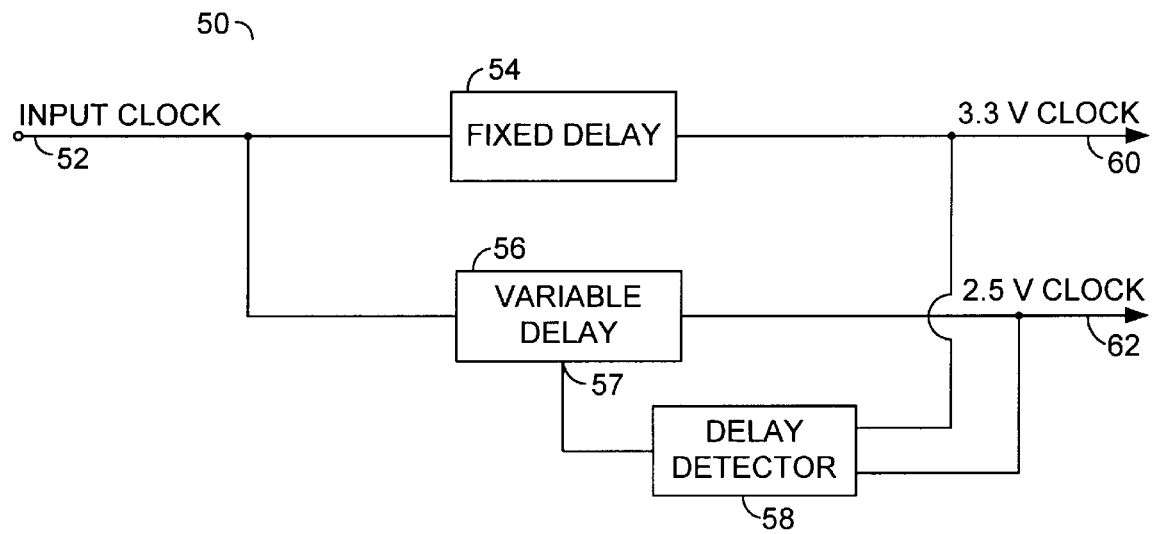
FIG. 3 is a third previous approach deskewing circuit.
Figure 4:
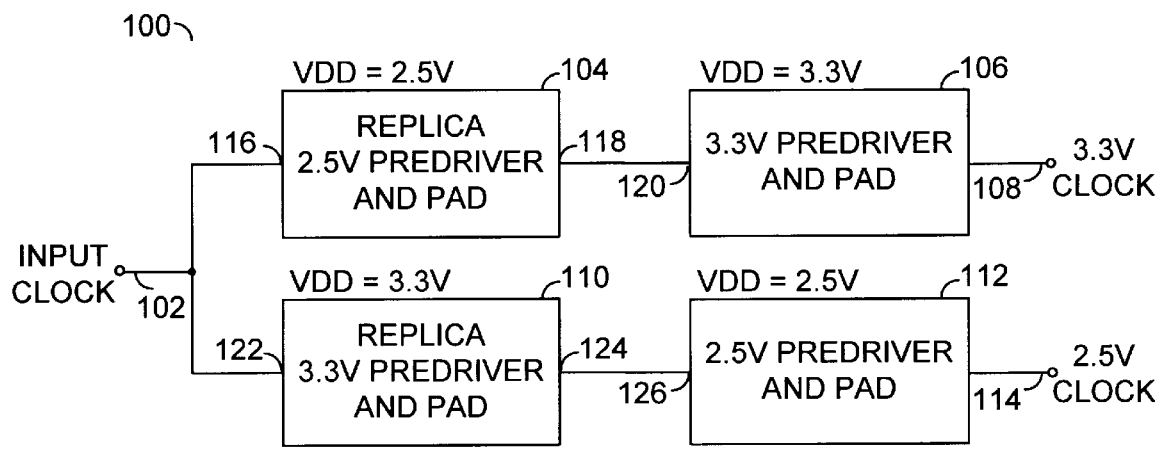
FIG. 4 is a block diagram of a preferred embodiment of the present invention.

Referring to FIG. 4, a block diagram of a circuit 100 is shown in accordance with a preferred embodiment of the present invention. The circuit 100 generally comprises an input 102, a replica block 104, a driver block 106, an output 108, a replica block 110, a driver block 112 and an output 114. A signal received at the input 102 is generally presented to an input 116 of the replica block 104. The replica block 104 has an output 118 that is generally coupled to an input 120 of the driver block 106. The input 102 is also presented to an input 122 of the replica block 110. An output 124 is generally coupled to an input 126 of the driver block 112. The driver blocks 106 and 112 each generally refer to a predriver circuit and a pad driver circuit.

The replica block 104 and the predrive block 112 generally comprise driver and pad circuits operating at a 2.5 volt supply voltage. The driver circuit 106 and the replica block 110 each generally comprises a predriver circuit and a pad circuit operating at a 3.3 volt supply voltage. When the input clock 102 propagates through the replica block 104 and the driver block 106, the signal presented at the output 108 generally experiences the delays associated with both a 3.3 volt supply voltage and a 2.5 volt supply voltage. Similarly, when the input clock 102 propagates through the replica block 110 and the driver block 112, the signal presented at the output 114 generally experiences delays associated with both a 3.3 volt supply voltage and a 2.5 volt supply voltage. As a result, the outputs 108 and 114 remain deskewed or synchronized. The signals presented at the outputs 108 and 114 may be clock signals oscillating at a particular frequency.

The replica block 104 and the driver block 112 have similar delays. Similarly, the driver block 106 has a similar delay as the replica block 110. While the signal at the output 108 first experiences the delays associated with the 2.5 volt supply voltage of the replica block 104 and then the delays associated with the 3.3 volt supply voltage of the driver block 106, the ultimate delay is similar to the delays associated through the replica block 110 and the driver block 112. This is true even though the replica block 110 first operates at the 3.3 volt supply voltage followed by the driver block 112 which operates at the 2.5 volt supply voltage. The 3.3 volt signal realized at the output 108 has the same delays as the 2.5 volt signal at the output 114. Thus, the sum of the delays for all the blocks in each path will be constant. Arbitrary power supply fluctuations in, for example, the 2.5 volt power supply, would be seen at both the output 108, through the replica block 104, and the output 114, through the driver block 112. As a result, the outputs 108 and 114 remain deskewed.

Figure 5:
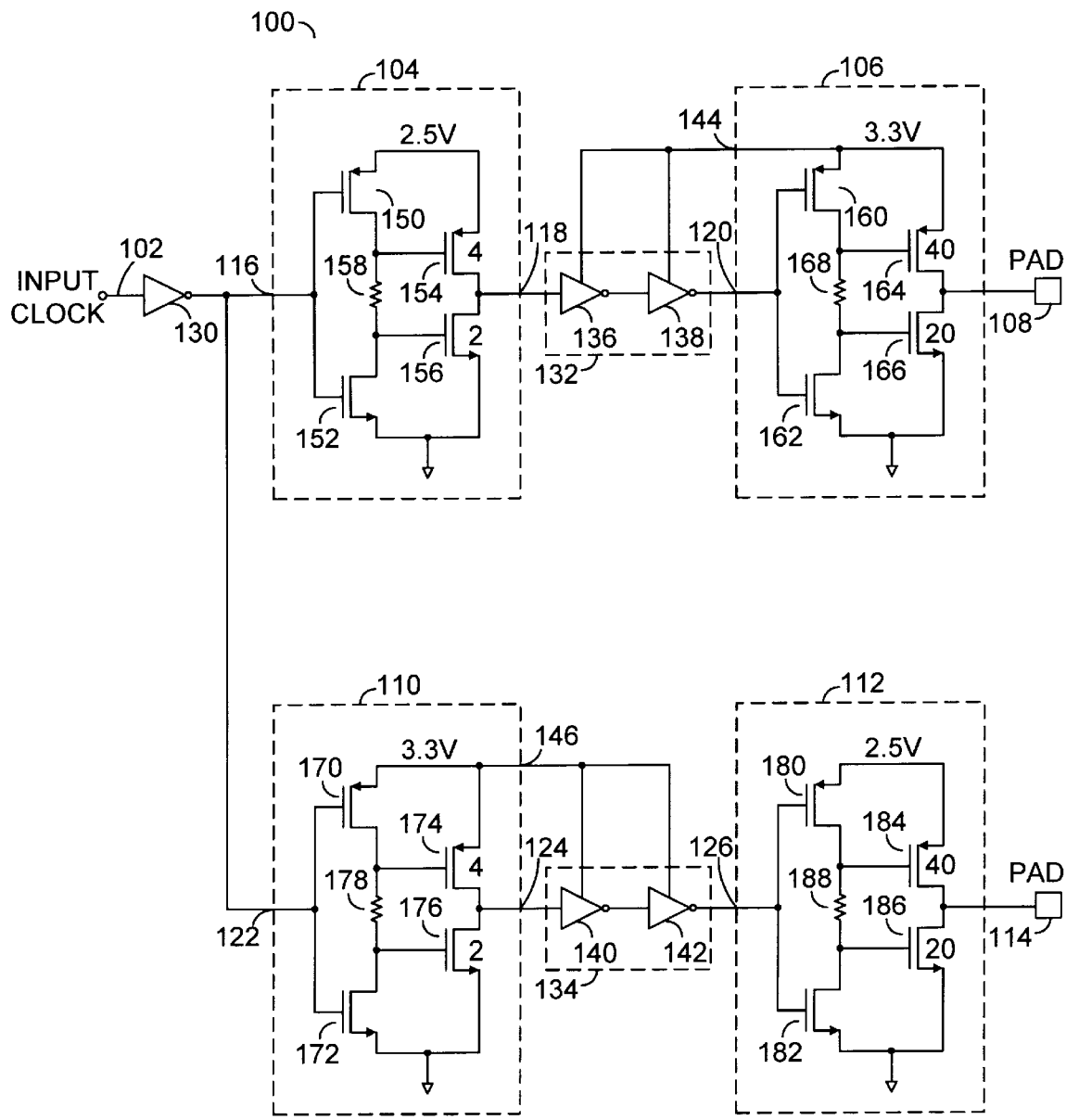
FIG. 5 is a circuit diagram of a preferred embodiment of the present invention.

Referring to FIG. 5, a more detailed diagram of the circuit 100 is shown. The circuit 100 further comprises an input buffer 130, a level shifting device 132 and a level shifting device 134. The buffer 130 is shown implemented as an inverter and is generally coupled between the input 102 and the inputs 116 and 122. The level shifting device 132 is generally coupled between the output 118 and the input 120. The level shifting device 132 generally comprises, in one example, an inverter 136 and an inverter 138, while the level shifting device 134 generally comprises, in one example, an inverter 140 and an inverter 142. The inverter 136 and the inverter 138 are generally coupled to an input 144 of the driver block 106 which is generally coupled to the 3.3 volt supply voltage. Similarly, the inverters 140 and 142 are coupled to an input 146 of the replica block 110 which is generally coupled to the 3.3 volt supply voltage. Since the level shifting device 132 and the level shifting device 134 are both connected to the 3.3 volt supplies, level shifting between the outputs 108 and 114 is realized.

When a signal is driven from a 2.5 volt supply to a 3.3 volt supply, such as at output 118, the edge of the signal generally has a finite slope. As either supply varies, a minor skew difference may be generated. The skew difference may come from either the slope changing if the 2.5 volt supply varies, or the switching point of the inverter 136 of the level shifting device 132 varying if the 3.3 volt supply varies. The level shifting device 132 is generally sized to provide a light load on the driver circuit 104 to create a sharp edge transition and minimize additional skew differences. A similar affect is realized at the input 126 where the signal is driven from a 3.3 volt supply to a 2.5 volt supply. The output drive of the inverter 142 of the level shifting device 134 is generally configured as a larger load when compared with the loading of the driver block 112. As a result, the edge transitions of the signal received at the output 114 remain sharp, which creates a minimum of additional delays.

The replica block 104 is shown generally comprising a transistor 150, a transistor 152, a transistor 154, a transistor 156 and a resistor 158. Similarly, the driver block 106 generally comprises a transistor 160, a transistor 162, a transistor 164, a transistor 166 and a resistor 168. The replica block 110 generally comprises a transistor 170, a transistor 172, a transistor 174, a transistor 176 and a resistor 178. The driver block 112 generally comprises a transistor 180, a transistor 182, a transistor 184, a transistor 186 and a resistor 188. The transistors 174 and 176 are shown to be sized as a fraction of the size of the transistors 164 and 166. The values noted are one example of a ratio that may be provided. The ratio, generally shown as 1/N, where N may be any value, may be adjusted to fit the design criteria of a particular application. The size of the transistors 154 and 156 is also shown to be a ratio, in this example 1/10, of the size of transistors 184 and 186. While the particular amount of ratio 1/N may be adjusted, once the ratio has been determined, it should maintained between the corresponding replica block and driver block. Specifically, if the ratio between the driver block 106 and the replica block 110 is a 1/10 ratio, then the ratio between the driver block 112 and the replica block 104 should also be a 1/10 ratio. By reducing the size of the replica blocks 104 and 110 by the ratio 1/N, the overall size of the circuit 100 may be reduced.

An alternate implementation of the replica block 104 and the replica block 110 may be realized by logic circuits having an other than one to one relationship between the driver blocks 110 and 112. However, by replicating each component of the driver block 110 and 112, design constraints associated with matching the precise amount of delay are generally eliminated. The ratio of 1/N between the driver block 110 and 112 and the replica block 104 and 110 is generally used to reduce the amount of area necessary to implement the replica blocks 104 and 110. The examples of a 2.5 volt and 3.3 volt supply voltage are used for illustrative purposes only. The circuit 100 will generally maintain a deskewed relationship at the outputs 104 and 114 with different supply voltages, such as between a 5 volt supply and a 3.3 volt supply or another voltage pair. Either power supply may have a wide supply range and still maintain this relationship. For example, if the 2.5 volt power supply was more susceptible to temperature and process variations, it may well have a much wider swing than the 3.3 volt power supply. However, since the 2.5 volt power supply would be used in, for example, both the replica block 104 and the driver block 112, the deskewed relationship at the outputs 108 and 114 will be maintained.

The present invention may be adapted to deskewing more than two clocks. In such a system, two or more replica blocks would generally be presented in each signal path. The replica blocks would, similar to the arrangement in FIGS. 4 and 5, compensate for the delay associated with the particular power supplies.

Figure 6:
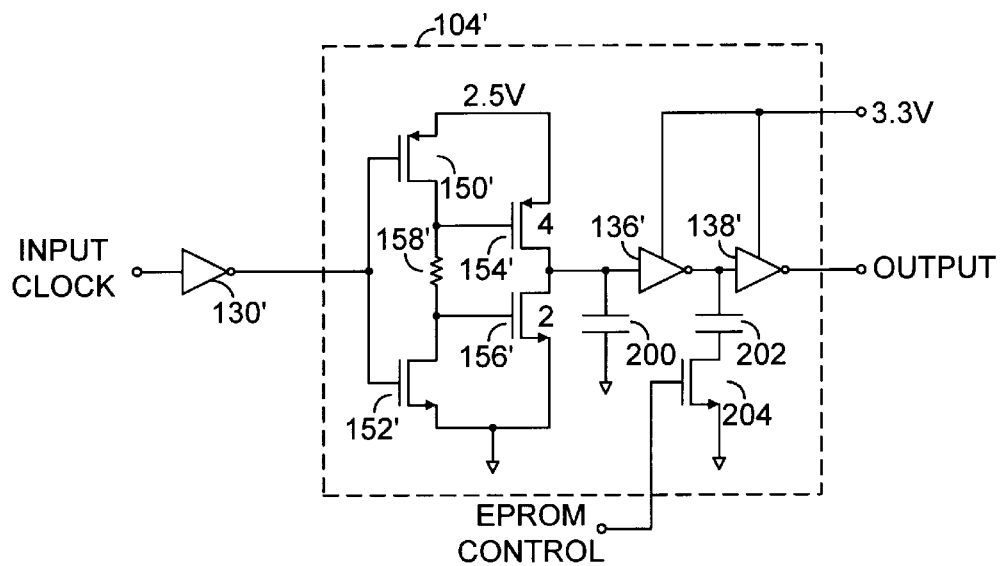
FIG. 6 is a circuit diagram of an alternate replica circuit shown in FIG. 4 and FIG. 5.

Referring to FIG. 6, an alternate implementation of a replica circuit 104' is shown. The replica block 104' is shown comprising an inverter 136', an inverter 138', a transistor 150', a transistor 152', a transistor 154', a transistor 156', a resistor 158', a capacitor 200, a capacitor 202 and a transistor 204. The transistors 150', 152', 154' and 156' as well as the resistor 158' and the inverter 130', the inverter 136' and the inverter 138' are shown configured similarly to the replica circuit 104 shown in FIG. 5. The capacitor 200 generally forms a load at the output of the transistors 154' and 156'. The capacitor 200 provides additional delay matching if the output loads are fixed. The capacitor 202 provides an adjustable capacitive load between the inverters 136' and 138' to provide delay matching if the output loads are not fixed. The capacitor 202 is generally coupled to the transistor 204. The transistor 204 generally provides a control for the amount of capacitance created between the inverters 136' and 138' based on a control signal received at its gate. The gate of the transistor 204 may be coupled to a control circuit, such as an EPROM control circuit which may control the amount of capacitance created by the capacitor 202. Additionally, several more capacitors with transistor switches may be added to achieve more tuning in order to meet the design criteria of a particular application. The EPROM control signal may also be implemented on a read only memory (ROM).

While the invention has been particularly shown and described with reference to the preferred embodiments thereof, it will be understood by those skilled in the art that various changes in form and details may be made without departing from the spirit and scope of the invention.

I claim:
1. An apparatus comprising:
   a first circuit operating at a first supply voltage configured to present a first output in response to an input;
   a second circuit operating at a second supply voltage configured to present a second output in response to said input;
   a third circuit coupled between said input and said first circuit, wherein said third circuit operates at said second supply voltage;
   a fourth circuit coupled between said input and said second circuit, wherein said fourth circuit operates at said first supply voltage, wherein said third and fourth circuits provide compensation such that said first and second outputs have a minimum skew;
   a fifth circuit coupled between said first and third circuits, wherein said fifth circuit is configured to provide (i) level shifting between said first and third circuits and (ii) an adjustable capacitive load; and
   a sixth circuit coupled between said first and third circuits, wherein said sixth circuit is configured to provide (i) level shifting between said second and fourth circuits and (ii) an adjustable capacitive load.

2. The apparatus according to claim 1 wherein said third and fourth circuits have a smaller area by a ratio of 1/N with respect to said first and second circuits.

3. The apparatus according to claim 1 wherein:
   said first circuit and said fourth circuit operate at one supply voltage; and
   said second circuit and said third circuit operate at another supply voltage, wherein said supply voltages are different.

4. The apparatus according to claim 1 wherein said first and second circuits each comprise a driver and pad circuit.

5. The apparatus according to claim 2 wherein said third and fourth circuits each comprise a driver and pad circuit reduced in size by said ratio with respect to said first and second circuits.

6. The apparatus according to claim 1 wherein said:
   fifth circuit comprises one or more inverters; and
   said sixth circuit comprises one or more inverters.

7. The apparatus according to claim 1 comprising:
   a plurality of said first and second circuits;
   a plurality of said third and fourth circuits; and
   a plurality of said first and second outputs, wherein one of said first and second circuits, one of said third and fourth circuits and one of said first and second outputs operate at a third supply voltage, wherein each of said first and second outputs has a minimum skew.

8. An apparatus comprising:
   first means for generating a first output operating at a first supply voltage in response to an input;
   second means for generating a second output operating at a second supply voltage in response to said input;
   first means for delaying said first output, said first delay means coupled between said input and said first generator means, wherein said first delay means operates at said second supply voltage;
   second means for delaying said second output, said second delay means coupled between said input and said second generator means, wherein said second delay means operates at said first supply voltage, wherein said first and second delay means provide compensation such that said first and second outputs have a minimum skew;

means for level shifting between said first generator means and said first delay means, comprising a first adjustable capacitive load; and means for level shifting between said second generator means and said second delay means, comprising a second adjustable capacitive load.

9. The apparatus according to claim 8 wherein said first and second delay means have a smaller area by a ratio of 1/N with respect to said first and second generator means.

10. The apparatus according to claim 8 wherein:

said first generator means and said second delay means operate at one supply voltage; and said second generator means and said first delay means operate at another supply voltage.

11. The apparatus according to claim 8 wherein said first and second level shifting means each further comprise an adjustable capacitive load.

12. A method for deskewing outputs of first and second circuits respectively operating at first and second supply voltages comprising the steps of:

delaying one of said outputs a sufficient time to deskew said outputs, wherein said delay corresponds to a propagation delay of one of said supply voltages;

adjusting a voltage level of one of said outputs using a variable capacitive load to compensate for said propagation delay;

delaying another one of said outputs by a second delay, wherein said second delay corresponds to a second propagation delay of another one of said supply voltages; and adjusting a voltage level of another one of said outputs using a variable capacitive load to compensate for said second propagation delay.

13. The method according to claim 12 wherein said level shifting steps each comprise the step of generating a fixed capacitive load.

14. The method according to claim 12 wherein said level shifting steps each comprise the step of generating a variable capacitive load.

15. The method according to claim 12 wherein said level shifting steps each comprise the step of:

generating a fixed capacitive load.

* * * * *